United States Patent
Lin et al.

(10) Patent No.: US 11,107,630 B2
(45) Date of Patent: Aug. 31, 2021

(54) INTEGRATION SCHEME FOR BREAKDOWN VOLTAGE ENHANCEMENT OF A PIEZOELECTRIC METAL-INSULATOR-METAL DEVICE

(71) Applicant: Taiwan Semiconductor Manufacturing Co., Ltd., Hsin-Chu (TW)

(72) Inventors: Anderson Lin, Hsinchu (TW); Chun-Ren Cheng, Hsin-Chu (TW); Chi-Yuan Shih, Hsinchu (TW); Shih-Fen Huang, Jhubei (TW); Yi-Chuan Teng, Zhubei (TW); Yi Heng Tsai, Hsinchu (TW); You-Ru Lin, New Taipei (TW); Yen-Wen Chen, Hsinchu County (TW); Fu-Chun Huang, Zhubei (TW); Fan Hu, Taipei (TW); Ching-Hui Lin, Taichung (TW); Yan-Jie Liao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/417,797

(22) Filed: May 21, 2019

(65) Prior Publication Data

US 2020/0098517 A1    Mar. 26, 2020

Related U.S. Application Data

(60) Provisional application No. 62/736,734, filed on Sep. 26, 2018.

(51) Int. Cl.
*H01G 4/012*     (2006.01)
*H01G 4/228*     (2006.01)
(Continued)

(52) U.S. Cl.
CPC ............... *H01G 4/012* (2013.01); *H01G 4/12* (2013.01); *H01G 4/228* (2013.01);
(Continued)

(58) Field of Classification Search
CPC ..................... H01L 41/0831; H01L 41/0838
See application file for complete search history.

(56) References Cited

U.S. PATENT DOCUMENTS

| | | | | |
|---|---|---|---|---|
| 5,410,208 A | * | 4/1995 | Walters | B06B 1/0622 310/334 |
| 2003/0048041 A1 | * | 3/2003 | Kita | G11B 5/5552 310/328 |

(Continued)

*Primary Examiner* — John A Bodnar
(74) *Attorney, Agent, or Firm* — Eschweiler & Potashnik, LLC

(57) ABSTRACT

Various embodiments of the present disclosure are directed towards a piezoelectric metal-insulator-metal (MIM) device including a piezoelectric structure between a top electrode and a bottom electrode. The piezoelectric layer includes a top region overlying a bottom region. Outer sidewalls of the bottom region extend past outer sidewalls of the top region. The outer sidewalls of the top region are aligned with outer sidewalls of the top electrode. The piezoelectric layer is configured to help limit delamination of the top electrode from the piezoelectric layer.

20 Claims, 7 Drawing Sheets

(51) Int. Cl.
  *H01L 49/02*   (2006.01)
  *H01L 21/3213*  (2006.01)
  *H01L 21/311*   (2006.01)
  *H01G 4/12*   (2006.01)
  *H01L 41/113*   (2006.01)
  *H01L 41/083*   (2006.01)
  *H01L 41/047*   (2006.01)

(52) U.S. Cl.
  CPC .. *H01L 21/31111* (2013.01); *H01L 21/32139* (2013.01); *H01L 28/60* (2013.01); *H01L 41/0472* (2013.01); *H01L 41/0831* (2013.01); *H01L 41/0838* (2013.01); *H01L 41/1132* (2013.01)

(56) References Cited

U.S. PATENT DOCUMENTS

| | | |
|---|---|---|
| 2005/0146772 A1 | 7/2005 | Murata et al. |
| 2014/0265726 A1 | 9/2014 | Andosca |
| 2017/0033713 A1* | 2/2017 | Petroni ................ H01L 41/047 |

* cited by examiner ptember 26, 2018, the
INTEGRATION SCHEME FOR BREAKDOWN VOLTAGE ENHANCEMENT OF A PIEZOELECTRIC METAL-INSULATOR-METAL DEVICE

REFERENCE TO RELATED APPLICATION

This Application claims the benefit of U.S. Provisional Application No. 62/736,734, filed on Sep. 26, 2018, the contents of which are hereby incorporated by reference in their entirety.

BACKGROUND

Piezoelectric devices (e.g., piezoelectric actuators, piezoelectric sensors, etc.) are used in many modern day electronic devices (e.g., automotive sensors/actuators, aerospace sensors/actuators, etc.). One example of a piezoelectric device is a piezoelectric actuator. A piezoelectric actuator can be utilized to create a physical movement that exerts a force on a physical part in a system under the control of an electrical signal. The physical movement generated by the piezoelectric actuator can be utilized to control various kinds of systems (e.g., mechanical systems, optical systems, etc.).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
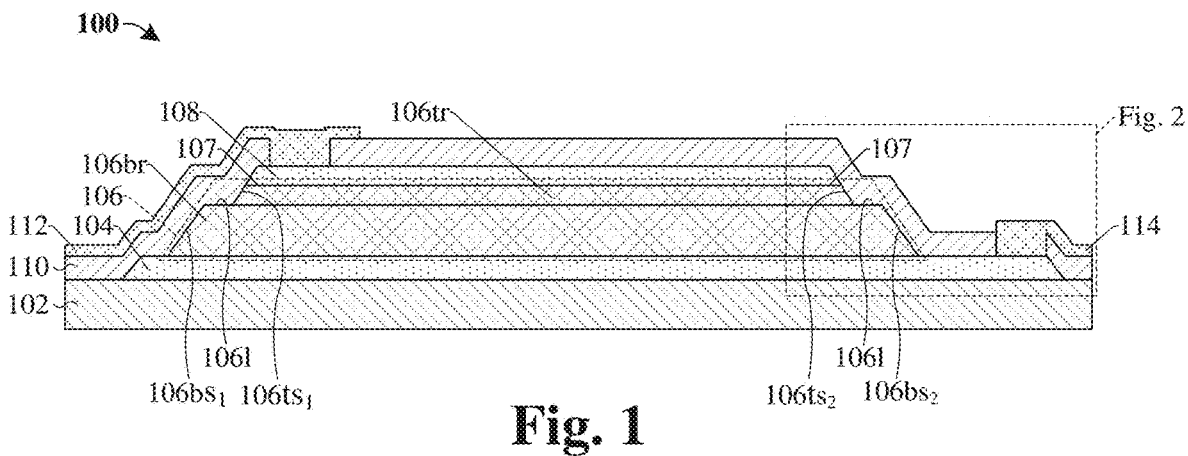
FIG. 1 illustrates a cross-sectional view of some embodiments of a metal-insulator-metal (MIM) capacitor having a piezoelectric structure comprising a ledge in contact with a passivation layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some piezoelectric devices include a piezoelectric structure between a top electrode and a bottom electrode referred to as a piezoelectric metal-insulator-metal (MIM) device. During formation of the piezoelectric MIM device, a piezoelectric layer is formed over a bottom metal layer and a top metal layer is formed over the piezoelectric layer. A patterning process is performed on the aforementioned layers to define the top electrode, the piezoelectric structure, and the bottom electrode of the piezoelectric MIM device. When a voltage is applied between the top electrode and the bottom electrode, an electrical field generated by the applied voltage can cause the piezoelectric structure to change from a first shape to a second shape. This change in shape can be used to control various kinds of systems (e.g., mechanical systems, optical systems, etc.).

A challenge with the above piezoelectric MIM device is premature device breakdown due to high physical strain. During operation of the piezoelectric MIM device a top edge of the top electrode in contact with the piezoelectric layer collects a high electrical field relative to the bottom electrode or middle area of the top electrode. The high electrical field at the top edge of the top electrode results in high physical strain at the top edge while the piezoelectric layer changes shape. This high physical strain causes the top edge to delaminate from the piezoelectric layer at a first bias voltage (e.g., a voltage of approximately 67 volts) resulting in a premature breakdown (e.g., breakdown may occur when the top electrode shorts to the bottom electrode) of the piezoelectric MIM device.

In some embodiments of the present disclosure, an improved method for manufacturing a piezoelectric MIM device that utilizes an over-etch process and formation of a passivation layer to mitigate premature device breakdown is provided. The improved method includes forming a piezoelectric layer over a bottom metal layer and forming a top metal layer over the piezoelectric layer. A first patterning process is performed on the top metal layer to define the top electrode. While performing the first patterning process an over-etch process is performed and a top region of the piezoelectric layer is patterned as well. A second patterning process is performed on a bottom region (directly underlying the top region) of the piezoelectric layer to define the piezoelectric structure. The second patterning process defines a ledge of the piezoelectric structure such that outer sidewalls of the top region of the piezoelectric structure are laterally offset from outer sidewalls of the bottom region of the piezoelectric structure. A top edge of the top electrode is in direct contact with a top edge of the top region of the piezoelectric structure. A third patterning process is performed on the bottom metal layer to define the bottom electrode. A passivation layer is formed over the top electrode, piezoelectric structure, and bottom electrode. The passivation layer is configured to clamp the top edge of the top electrode to the top region of the piezoelectric structure such that the improved process mitigates the effects of the high physical strain experienced at the top edge of the top electrode.

During operation of the piezoelectric MIM device the passivation layer acts as a clamp that prevents the top edge of the top electrode from delaminating from the piezoelectric structure, especially under stressed conditions (i.e., high electrical field, high temperatures, and adverse environmental conditions). The clamping effect is due to the formation of the ledge in the piezoelectric structure before forming the passivation layer, this causes the passivation layer to have a straight segment overlying an interface between the top edge and the passivation structure. This, in turn, prevents the premature breakdown of the piezoelectric MIM device and device breakdown may occur at a second bias voltage (e.g., a voltage of approximately 110 volts) greater than the first bias voltage. Further, the top edge of the top electrode may not delaminate before or during the device breakdown at the second bias voltage. Therefore, the over-etch and clamping effect from the passivation layer increases the voltage the piezoelectric MIM device can operate at before breakdown occurs, thus increasing device performance, reliability, and structural integrity.

Referring to FIG. 1, a cross-sectional view of a piezoelectric metal-insulator-metal (MIM) device 100 in accordance with some embodiments is provided.

The piezoelectric MIM device 100 includes a bottom electrode 104 overlying a substrate 102. A piezoelectric structure 106 is disposed between a top electrode 108 and the bottom electrode 104. A passivation layer 110 overlies the top electrode 108, the piezoelectric structure 106, and the bottom electrode 104. A first conductive contact 112 overlies the passivation layer 110 and directly contacts the top electrode 108 on a first side of the piezoelectric MIM device 100. A second conductive contact 114 overlies the passivation layer 110 and directly contacts the bottom electrode 104. The first and second conductive contacts 112, 114 are respectively electrically coupled to the top electrode 108 and the bottom electrode 104.

The piezoelectric structure 106 comprises a top region 106tr directly overlying a bottom region 106br. The piezoelectric structure 106 is a single continuous material from a bottom surface of the bottom region 106br to a top surface of the top region 106tr. In some embodiments, the top region 106tr is a first piezoelectric material and the bottom region 106br is a second piezoelectric material different than the first piezoelectric material (not shown). The bottom region 106br comprises a first pair of opposing sidewalls 106bs$_1$, 106bs$_2$ and the top region 106tr comprises a second pair of opposing sidewalls 106ts$_1$, 106ts$_2$. The second pair of opposing sidewalls 106ts$_1$, 106ts$_2$ of the top region 106tr are laterally offset the first pair of opposing sidewalls 106bs$_1$, 106bs$_2$ of the bottom region 106br by a ledge 106l of the piezoelectric structure 106. The passivation layer 110 continuously extends from a top surface of the top electrode 108 across the second pair of opposing sidewalls 106ts$_1$, 106ts$_2$, the ledge 106l, and the first pair of opposing sidewalls 106bs$_1$, 106bs$_2$ to a top surface of the bottom electrode 104. The passivation layer 110 includes a segment that extends along a straight line from the ledge 106l to the top surface of the top electrode 108 such that the passivation layer 110 acts as a clamp on an interface 107 between the top electrode 108 and the piezoelectric structure 106. This, in turn, increases the structural integrity of the top electrode 108 and the piezoelectric structure 106 at the interface 107.

During operation of the piezoelectric MIM device 100 a voltage is applied between the top electrode 108 and the bottom electrode 104. An electrical field generated by the applied voltage can cause the piezoelectric structure 106 to change from a first shape to a second shape (not shown). This change in shape may be used to control various kinds of systems (e.g., mechanical systems, optical systems, etc.). Further, the change in shape results in mechanical stress on the piezoelectric MIM device 100 especially as the applied voltage increases. As the applied voltage increases, for example, to a first bias voltage (e.g., a voltage within a range of approximately 67-109 volts) a high local electrical field will collect at a top edge of the top electrode 108 at the interface 107. The high local electrical field causes the top edge of the top electrode 108 to be susceptible to delamination. However, the shape of the passivation layer 110 over the top electrode 108 and the piezoelectric structure 106 is configured to clamp the top edge of the top electrode 108 to the piezoelectric structure 106 at the interface 107. This, in turn, prevents delamination of the top electrode 108 at the first bias voltage. Further, as the applied voltage reaches a break down bias voltage (e.g., approximately 110 volts or greater), the breakdown may not occur at the top edge of the top electrode 108, but instead at a different location. Therefore, the clamp effect of the passivation layer 110 at the interface 107 increases the structural integrity, voltage operation range, and reliability of the piezoelectric MIM device 100.

Figure 2:
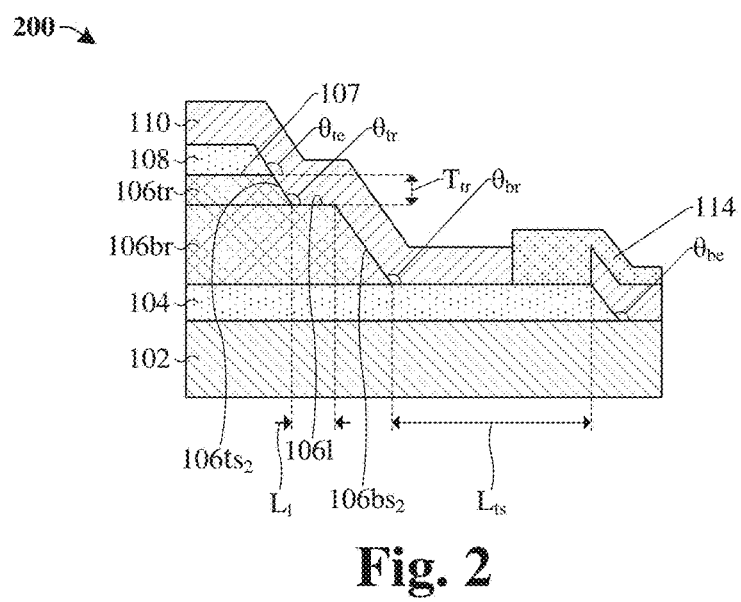
FIG. 2 illustrates a cross-sectional view of a close-up of a first side of the MIM capacitor of FIG. 1.

Referring to FIG. 2, some embodiments of a cross-sectional view 200 of a portion of the piezoelectric MIM device 100 of FIG. 1, as indicated by the dashed outline box shown in FIG. 1 is provided.

As seen in the cross-sectional view 200 a plurality of angles, lengths and thicknesses are labeled. Unless otherwise stated, an angle in the plurality of angles is defined relative to a flat horizontal line. A sidewall of the top electrode 108 is angled at a non-zero top electrode sidewall angle $\theta_{te}$ relative to a flat horizontal line extending across a bottom surface of the top electrode 108. A first outer sidewall 106ts$_2$ of the top region 106tr is angled at a non-zero top region sidewall angle $\theta_{tr}$ relative to a ledge 106l. In some embodiments, the top electrode sidewall angle $\theta_{te}$ and the top region sidewall angle $\theta_{tr}$ are equal. In some embodiments, the top electrode sidewall angle $\theta_{tr}$ and the top region sidewall angle $\theta_{tr}$ may, for example, be within a range of approximately 90 to 170 degrees. A first outer sidewall 106bs$_2$ of the bottom region 106br is angled at a non-zero bottom region sidewall angle $\theta_{br}$ relative to a top surface of the bottom electrode 104. In some embodiments, the bottom region sidewall angle $\theta_{br}$ may, for example, be within a range of approximately 90 to 170 degrees. A sidewall of the bottom electrode 104 is angled at a non-zero bottom electrode sidewall angle $\theta_{be}$ relative to a top surface of the substrate 102. In some embodiments, the bottom electrode sidewall angle $\theta_{be}$ may, for example, be within a range of approximately 90 to 170 degrees. While the respective opposing sidewall of each sidewall referenced above is not shown in cross-sectional view 200, it may be appreciated that the respective opposing sidewall illustrated in FIG. 1 of each sidewall referenced above has the same sidewall angle. For example, a second outer sidewall (106ts$_1$ of FIG. 1) of the top region 106tr is angled at the non-zero top region sidewall angle $\theta_{tr}$ relative to the ledge 106l.

In some embodiments, a thickness $T_{tr}$ of the top region is within a range of approximately 1 to 4 Angstroms, 10 to 400 Angstroms, 0.1 to 0.4 micrometers, 1 to 40 micrometers, or 100 to 400 micrometers. In some embodiments, the thickness $T_{tr}$ of the top region 106tr is at least half as thick as the bottom region 106br. In some embodiments, a thickness of the bottom region 106br is within a range of 2 to 10 times greater than the thickness $T_{tr}$ of the top region 106tr. In some embodiments, if the thickness of the bottom region 106br is, for example, greater than 10 times thicker than the thickness $T_{tr}$ of the top region 106tr, the passivation layer 110 may be unable to effectively clamp the top electrode 108 to the top region 106tr and delamination at the interface 107 may occur. In some embodiments, a length $L_1$ of the ledge 106l is within a range of approximately 5 to 100 Angstroms, 50 to 1000 Angstroms, 0.05 to 1 micrometers, 0.5 to 100 micrometers, or 50 to 1000 micrometers. In some embodiments, a length $L_{ts}$ of a segment of a top surface of the bottom electrode 104 between a lower bottom edge of the bottom region 106tr and a top edge of the bottom electrode 104 is within a range of approximately 10 to 100 Angstroms, 100 to 1000 Angstroms, 0.1 to 1 micrometers, 1 to 100 micrometers, or 100 to 1000 micrometers. In some embodiments, the length $L_{ts}$ of the segment of the top surface of the bottom electrode 104 is within a range of 0.5 to 10 times greater than the length $L_1$ of the ledge 106l. In some embodiments, if the length $L_1$ of the ledge 106l is, for example, too small (e.g., less than 5 Angstroms) then the passivation layer 110 may not have a proper shape over the interface 107.

Figure 3:
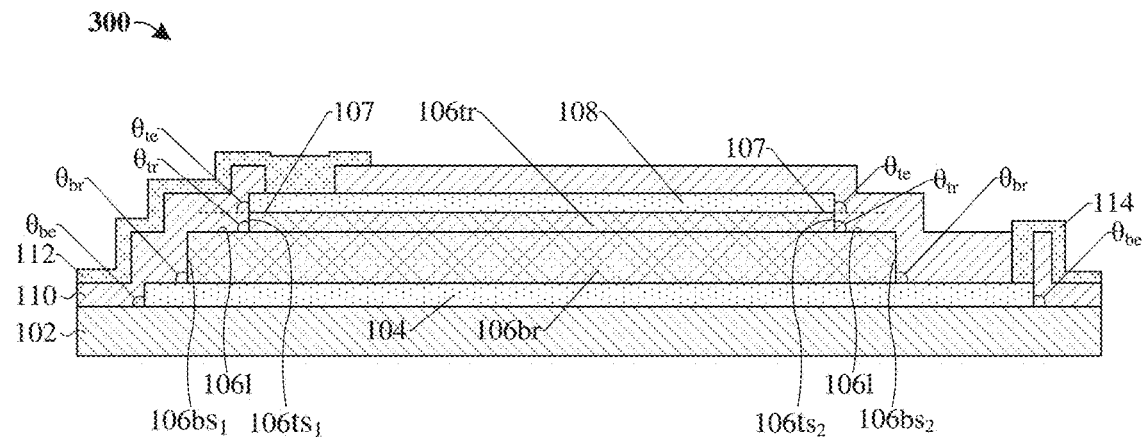
FIG. 3 illustrates a cross-sectional view of some alternative embodiments of the MIM capacitor of FIG. 1.

With reference to FIG. 3, a cross-sectional view of a piezoelectric MIM device 300 according to some alternative embodiments of the piezoelectric MIM device 100 of FIG. 1 is provided in which outer sidewalls of the top electrode 108, top region 106tr, bottom region 106br, and bottom electrode 104 are respectively vertical.

Outer sidewalls of the top electrode 108 are respectively angled by a top electrode sidewall angle $\theta_{te}$ (e.g., 90 degrees) relative to a flat horizontal line extending across a bottom surface of the top electrode 108. The top region 106tr comprises the second pair of opposing sidewalls $106ts_1$, $106ts_2$ respectively angled by a top region sidewall angle $\theta_{tr}$ (e.g., 90 degrees) relative to the ledge 106l. The bottom region 106br comprises the first pair of opposing sidewalls $106bs_1$, $106bs_2$ respectively angled by a bottom region sidewall angle $\theta_{br}$ (e.g., 90 degrees) relative to a top surface of the bottom electrode 104. Outer sidewalls of the bottom electrode 104 are respectively angled by a bottom electrode sidewall angle $\theta_{be}$ (e.g., 90 degrees) relative to a top surface of the substrate 102. Therefore, the aforementioned sidewalls outlined above are angled at a same angle value (i.e., 90 degrees). In some embodiments, the aforementioned sidewalls outlined above are angled at the same angle value such as, for example, 100 degrees, 135 degrees, or a value within a range of approximately 90 to 170 degrees.

Figure 4:
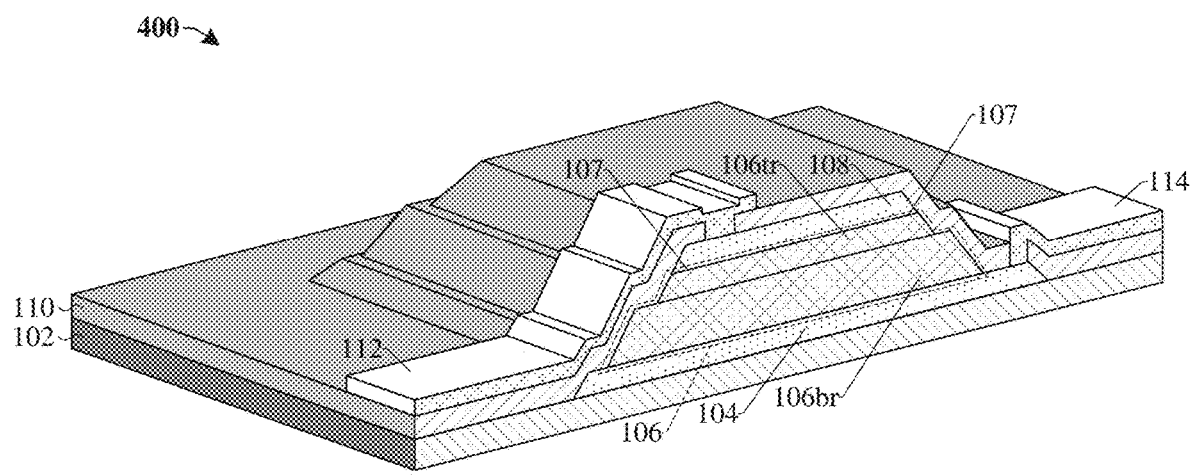
FIG. 4 illustrates a perspective view of some embodiments of a MIM capacitor having a piezoelectric structure comprising a ledge in contact with a passivation layer.

With reference to FIG. 4, a perspective view of a piezoelectric MIM device 400 according to some alternative embodiments of the piezoelectric MIM device 100 of FIG. 1 is provided.

The piezoelectric MIM device 400 includes a substrate 102 below a bottom electrode 104. A piezoelectric structure 106 overlies the bottom electrode 104. The piezoelectric structure 106 comprises a top region 106tr directly overlying a bottom region 106br. A top electrode 108 overlies the piezoelectric structure 106 such that outer sidewalls of the top electrode 108 are aligned with outer sidewalls of the top region 106tr. A passivation layer 110 overlies the top electrode 108, the piezoelectric structure 106, the bottom electrode 104, and the substrate 102. A first conductive contact 112 overlies the passivation layer 110 and directly contacts the top electrode 108. A second conductive contact 114 overlies the passivation layer 110 and directly contacts the bottom electrode 104. The first and second conductive contacts 112, 114 are respectively electrically coupled to the top electrode 108 and the bottom electrode 104. During operation of the piezoelectric MIM device 400 a bias voltage is applied between the first and second conductive contacts 112, 114.

The passivation layer 110 is configured to clamp the top electrode 108 to the top region 106tr of the piezoelectric structure 106 at an interface 107. The passivation layer 110 directly contacts outer sidewalls of the top electrode 108, outer sidewalls of the top region 106tr, outer sidewalls of the bottom region 106br, and outer sidewalls of the bottom electrode 104. The passivation layer extends continuously from a top surface of the top electrode 108 to a top surface of the substrate 102.

Figure 5:
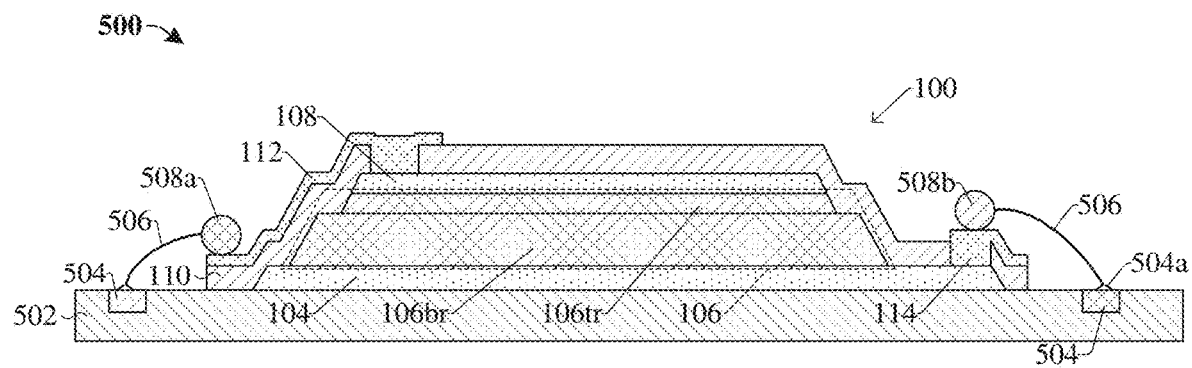
FIG. 5 illustrates a cross-sectional view of some alternative embodiments of the MIM capacitor of FIG. 1.

With reference to FIG. 5, a cross-sectional view of some embodiments of an integrated chip 500 including the piezoelectric MIM device 100 of FIG. 1 is provided in which the first and second conductive contacts 112, 114 are respectively wired bonded to metal lines 504 disposed within a printed circuit board (PCB) substrate 502.

The integrated chip 500 includes the piezoelectric MIM device 100 overlying the PCB substrate 502. A bottom electrode 104 overlies the PCB substrate 502. A piezoelectric structure 106 overlies the bottom electrode 104. The piezoelectric structure 106 comprises a top region 106tr directly overlying a bottom region 106br. A maximum width of the top region 106tr is less than a minimum width of the bottom region 106br. A top electrode 108 overlies the piezoelectric structure 106 such that outer sidewalls of the top electrode 108 are aligned with outer sidewalls of the top region 106tr. A passivation layer 110 overlies the top electrode 108, the piezoelectric structure 106, the bottom electrode 104, and the substrate 102. A first conductive contact 112 overlies the passivation layer 110 and directly contacts the top electrode 108 on a first side of the piezoelectric MIM device 100. A second conductive contact 114 overlies the passivation layer 110 and directly contacts the bottom electrode 104. The first and second conductive contacts 112, 114 are respectively electrically coupled to the top electrode 108 and the bottom electrode 104.

The PCB substrate 502 comprises the metal lines 504. Electrical connector pads 504a respectively overlie the metal lines 504. A first solder ball 508a overlies the first conductive contact 112. A second solder ball 508b overlies the second conductive contact 114. The first and second solder balls 508a, 508b provide contacts points for conductive wires 506. The conductive wires 506 directly contact the metal lines 504 and the connector pads 504a. In some embodiments, the conductive wires 506 are electrically coupled to a different independent device (not shown). In some embodiments, the metal lines 504 are electrically coupled to electronic devices (e.g., transistors, resistors, capacitors, varactors, etc.) through a back end of line (BEOL) interconnect structure underlying the metal lines 504 (not shown).

In some embodiments, the passivation layer 110 may, for example, be or comprise ceramic, metal oxide, carbide, silicon oxide, nitride, or the like formed to a thickness within a range of approximately 1000 to 3000 Angstroms. In some embodiments, if the passivation layer 110 is formed to a thickness less than approximately 1000 Angstroms, the piezoelectric MIM device 100 may have insufficient structural integrity. This, in turn, may result in premature breakdown at a bias voltage (e.g., 67 volts) less than approximately 110 volts. In some embodiments, if the passivation layer 110 is formed to a thickness greater than approximately 3000 Angstroms, the piezoelectric MIM device 100 may have increased structural integrity but device performance will be degraded (e.g., when the piezoelectric MIM device 100 is configured as an actuator). This, in turn, may mitigate the change in shape the piezoelectric structure 106 may undergo.

In some embodiments, the top electrode 108 and the bottom electrode 104 may, for example, be or comprise stainless steel, brass, copper, galvanized iron, lead, monel, nickel, nickel-chromium, zinc, bronze, aluminum, platinum, gold, ruthenium, graphite, calcium, lithium fluoride, molybdenum(VI) oxide, silver, palladium, Tin, scandium, titanium, vanadium, chromium, manganese, cobalt, gallium, indium, thallium, doped silicon, polysilicon, germanium, antimony, tungsten, hafnium, iridium, mixed metal oxide, titanium nitride, tantalum nitride, or the like. In some embodiments, the top electrode 108 and/or the bottom electrode 104 may, for example, be formed to a thickness within a range of approximately 10 to 100 Angstroms, 100 to 1000 Angstroms, 0.1 to 1 micrometers, 1 to 100 micrometers, or 100 to 1000 micrometers. In some embodiments, the piezoelectric structure 106 may, for example, be or comprise a piezoelectric material, aluminum nitride, lead zirconate titanate (e.g., $Pb[Zr_xTi_{1-x}]O_3$, where x is a suitable positive number), zinc oxide, or the like formed to a thickness within a range of approximately 10 to 100 Angstroms, 100 to 1000 Angstroms, 0.1 to 1 micrometers, 1 to 100 micrometers, or 100 to 1000 micrometers.

FIGS. 6-14 illustrate cross-sectional views 600-1400 of some embodiments of a method of forming a piezoelectric metal-insulator-metal (MIM) device according to the present disclosure. Although the cross-sectional views 600-1400 shown in FIGS. 6-14 are described with reference to a method, it will be appreciated that the structures shown in FIGS. 6-14 are not limited to the method but rather may stand alone separate of the method. Although FIGS. 6-14 are described as a series of acts, it will be appreciated that these acts are not limiting in that the order of the acts can be altered in other embodiments, and the methods disclosed are also applicable to other structures.

Figure 6:
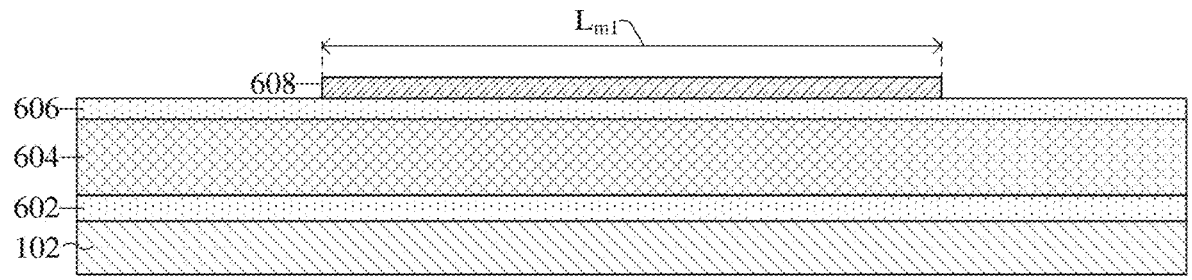
FIGS. 6-14 illustrate cross-sectional views of some embodiments of forming a MIM capacitor having a piezoelectric structure comprising a ledge in contact with a passivation layer.

As shown in cross-sectional view 600 of FIG. 6, a substrate 102 is provided. A bottom metal layer 602 is formed over the substrate 102. A piezoelectric layer 604 is formed over the bottom metal layer 602. A top metal layer 606 is formed over the piezoelectric layer 604. A first masking layer 608 is formed over the top metal layer 606. The first masking layer 608 has a length $L_{m1}$ defined between outer sidewalls of the first masking layer 608.

Figure 7:
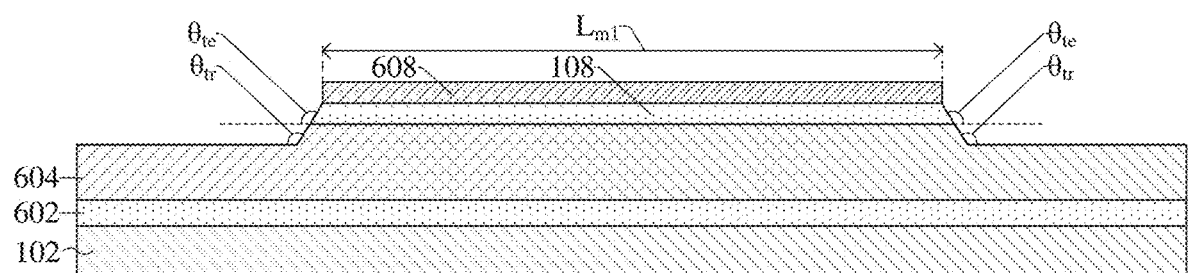

As shown in cross-sectional view 700 of FIG. 7, a first patterning process is performed on the structure of FIG. 6 according to the first masking layer 608. In some embodiments, the first patterning process removes an entire thickness of the top metal layer (606 of FIG. 6) laterally offset outer sidewalls of the first masking layer 608, thereby defining a top electrode 108. An etching process is used to define the top electrode 108 and over-etches into the piezoelectric layer 604 to define a top region of the piezoelectric layer 604. In some embodiments, the top metal layer (606 of FIG. 6) and the top region of the piezoelectric layer 604 are etched by a single etchant in a single etching process. Outer sidewalls of the top electrode 108 are aligned with outer sidewalls of the top region. The outer sidewalls of the top electrode 108 are respectively angled by a top electrode sidewall angle $\theta_{te}$ relative to a flat horizontal line extending across a bottom surface of the top electrode 108. The outer sidewalls of the top region are respectively angled by a top region sidewall angle $\theta_{tr}$ relative to a straight horizontal line aligned with a bottom surface of the top region. In some embodiments, the first patterning process includes a low selectivity dry etch, but other etch processes are amendable. A removal process is performed to remove the first masking layer 608 (not shown).

In further embodiments, the first patterning process includes performing a dry etch process (e.g., an ion-beam etch process). In such embodiments, the dry etch process may be performed at a non-zero angle relative to a substantially vertical line that is perpendicular to a top surface of the substrate 102. In such embodiments, the angle of the dry etch process may be set to define the top electrode sidewall angle $\theta_{te}$ and/or the top region sidewall angle $\theta_{tr}$. Additionally, the dry etch process is performed in such a manner that outer sidewalls of the top electrode 108 and sidewalls of the piezoelectric layer 604 are substantially aligned. This may be due to the low selectivity dry etch and/or the angle the dry etch process is performed at. In yet further embodiments, the first patterning process may form an undercut profile in the top electrode 108, wherein outer sidewalls of the top electrode 108 are spaced laterally between outer sidewalls of the first masking layer 608.

Figure 8:
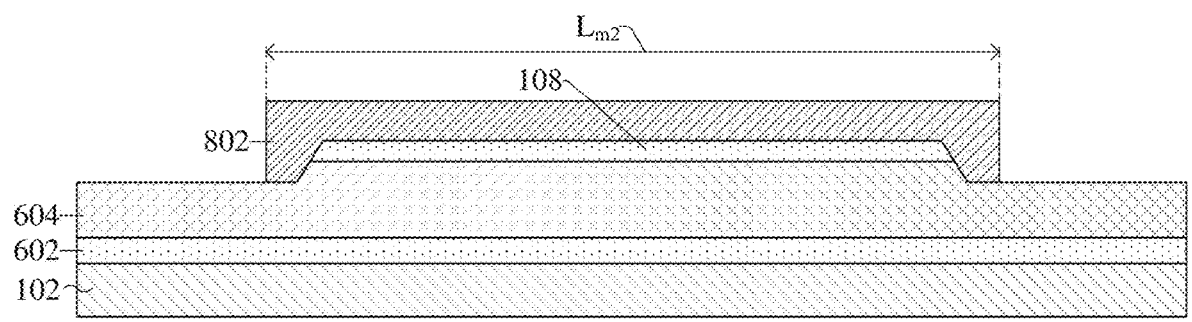

As shown in cross-sectional view 800 of FIG. 8, a second masking layer 802 is formed over the top electrode 108 and the piezoelectric layer 604. The second masking layer 802 has a length $L_{m2}$ defined between outer sidewalls of the second masking layer 802. In some embodiments, the length $L_{m1}$ of the first masking layer (608 of FIG. 6) is less than the length $L_{m2}$ of the second masking layer 802. In some embodiments, the second masking layer 802 is configured to protect the outer sidewalls of the top electrode 108 and sidewalls of the piezoelectric layer 604 during subsequent processing steps (e.g., the second patterning process of FIG. 9). Further, the second masking layer 802 is configured to define and/or protect the ledge (106*l* of FIG. 9) of the piezoelectric structure (106 of FIG. 9).

Figure 9:
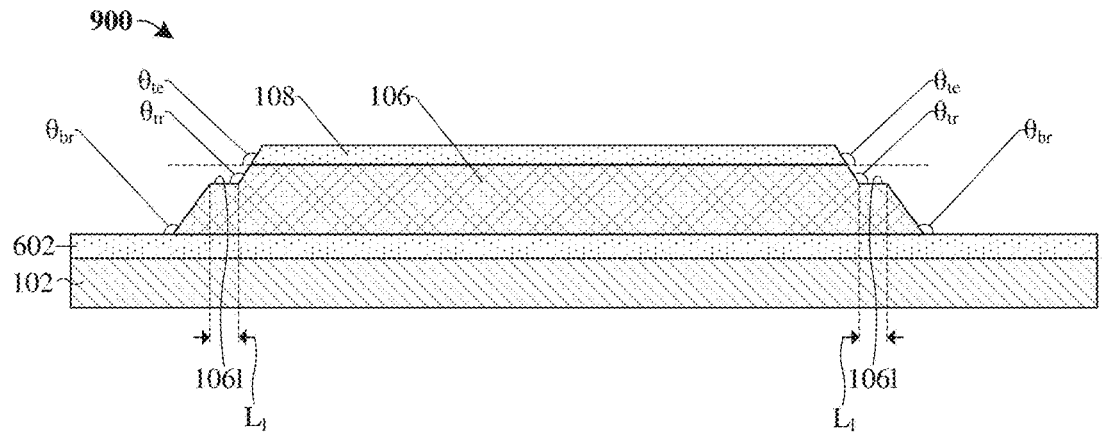

As shown in cross-sectional view 900 of FIG. 9, a second patterning process is performed on the structure of FIG. 8 according to the second masking layer (802 of FIG. 8). The second patterning process removes an entire thickness of the piezoelectric layer (604 of FIG. 8) laterally offset outer sidewall of the second masking layer (802 of FIG. 8) defining a piezoelectric structure 106. The second patterning process defines a bottom region of the piezoelectric structure 106 directly underlying the top region of the piezoelectric structure 106 and a ledge 106*l* of the piezoelectric layer 106. Outer sidewalls of the top region are laterally offset outer sidewalls of the bottom region by the ledge 106*l*. In some embodiments, a length $L_l$ of the ledge 106*l* is within a range of approximately 5 to 100 Angstroms, 50 to 1000 Angstroms, 0.05 to 1 micrometers, 0.5 to 100 micrometers, or 50 to 1000 micrometers. The outer sidewalls of the bottom region of the piezoelectric structure 106 are respectively angled by a bottom region sidewall angle $\theta_{br}$ relative to a top surface of the bottom metal layer 602. In some embodiments, the second patterning process includes a low selectivity dry etch, but other etch processes are amendable. The top region sidewall angle $\theta_{tr}$, ledge 106*l*, and bottom region angle $\theta_{br}$ help to clamp the top electrode 108 to the piezoelectric structure 106 and the bottom metal layer 602, so as to help limit delamination.

Figure 10:
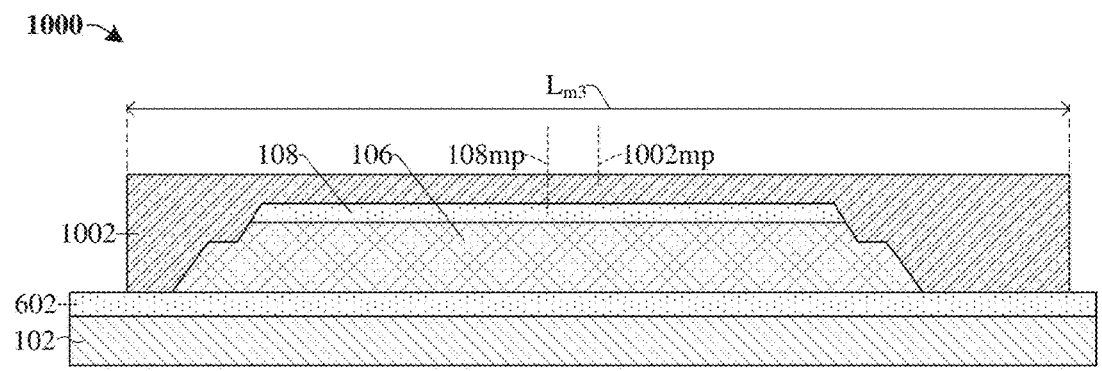

As shown in cross-sectional view 1000 of FIG. 10, a third masking layer 1002 is formed over the top electrode 108, the piezoelectric structure 106, and the bottom metal layer 602. A midpoint 1002mp of the third masking layer 1002 is laterally offset a midpoint 108mp of the top electrode 108 and the piezoelectric structure 106. In some embodiments, the midpoint 1002mp of the third masking layer 1002 is vertically aligned with the midpoint 108mp of the top electrode 108 and a midpoint of the piezoelectric structure 106 (not shown). The third masking layer 1002 has a length $L_{m3}$ defined between outer sidewalls of the third masking layer 1002. In some embodiments, the second length $L_{m2}$ of the second masking layer (802 of FIG. 8) is less than the length $L_{m3}$ of the third masking layer 1002. In such embodiments, the length $L_{m3}$ is greater than the length $L_{m1}$ of the first masking layer (608 of FIG. 6). In some embodiments, a size of the third masking layer 1002 is greater than a size of the second masking layer (802 of FIG. 8), and the size of the second masking layer (802 of FIG. 8) is greater than a size of the first masking layer (608 of FIG. 6). In further embodiments, a height of the third masking layer 1002 is greater than a height of the second masking layer (802 of FIG. 8), and the height of the second masking layer (802 of FIG. 8) is greater than a height of the first masking layer (608 of FIG. 6). The third masking layer 1002 is configured to protect the outer sidewalls of the top electrode 108, sidewalls of the piezoelectric structure 106, and/or the ledge (106l of FIG. 9) of the piezoelectric structure 106 from subsequent processing steps (e.g., the third patterning process of FIG. 11).

Figure 11:
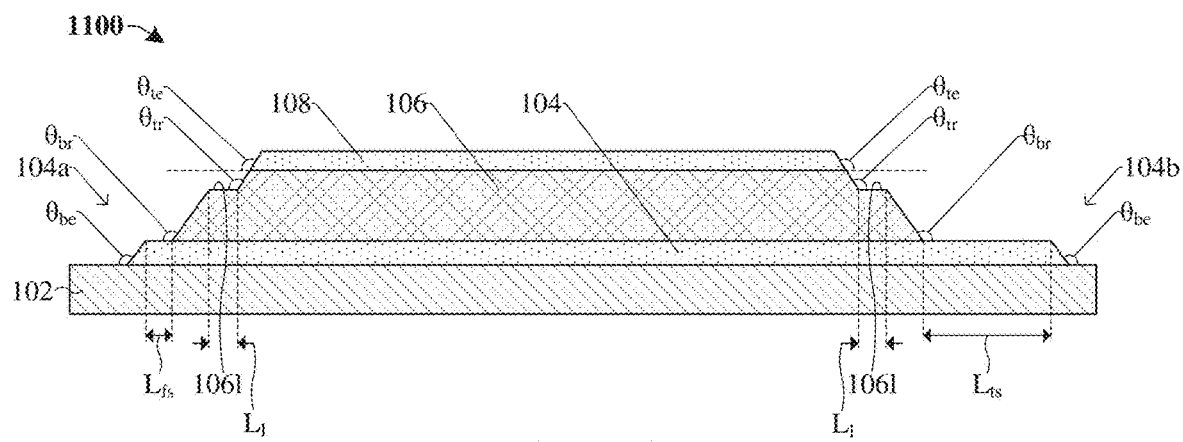

As shown in cross-sectional view 1100 of FIG. 11, a third patterning process is performed on the structure of FIG. 10 according to the third masking layer (1002 of FIG. 10). The third pattering process removes an entire thickness of the bottom metal layer (602 of FIG. 10) laterally offset outer sidewalls of the third masking layer (1002 of FIG. 10) defining a bottom electrode 104. In some embodiments, a length $L_{fs}$ of a segment of the bottom electrode 104 on a first side 104a between a first outer sidewall of the bottom region of the piezoelectric structure 106 and a first top edge of the bottom electrode 104 is within a range of approximately 1 to 25 Angstroms, 1 to 250 Angstroms, 0.01 to 0.25 micrometers, 0.1 to 25 micrometers, or 10 to 250 micrometers. In some embodiments, a length $L_{ts}$ of a segment of the bottom electrode 104 on a second side 104b between a second outer sidewall of the bottom region of the piezoelectric structure 106 and a second top edge of the bottom electrode 104 is within a range of approximately 10 to 100 Angstroms, 100 to 1000 Angstroms, 0.1 to 1 micrometers, 1 to 100 micrometers, or 100 to 1000 micrometers. In some embodiments, the length $L_{ts}$ of the segment of the bottom electrode 104 on the second side 104b is within a range of 2 to 10 times greater than the length $L_{fs}$ of the segment of the bottom electrode 104 on the first side 104a. Outer sidewalls of the bottom electrode 104 are respectively angled by a bottom electrode sidewall angle $\theta_{be}$ relative to a top surface of the substrate 102.

Figure 12:
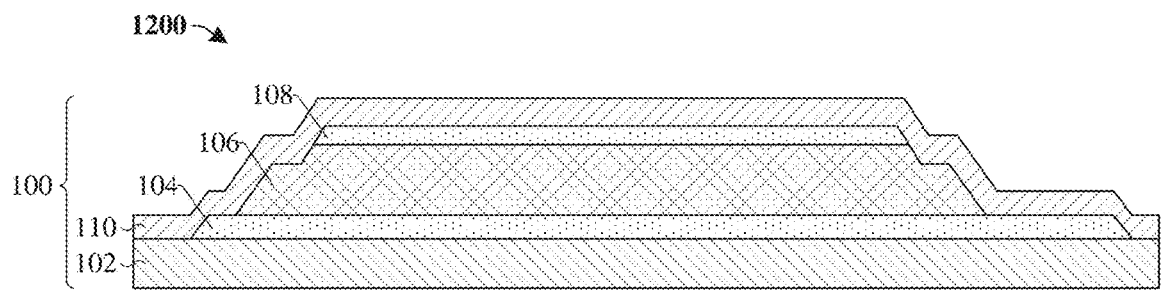

As shown in cross-sectional view 1200 of FIG. 12, a passivation layer 110 is formed over the top electrode 108, the piezoelectric structure 106, the bottom electrode 104, and the substrate 102 define a piezoelectric MIM device 100. In some embodiments, the passivation layer 110 may, for example, be or comprise ceramic, metal oxide, carbide, silicon oxide, nitride, or the like formed to a thickness within a range of approximately 1000 to 3000 Angstroms. In some embodiments, if the passivation layer 110 is formed to a thickness less than approximately 1000 Angstroms, the piezoelectric MIM device 100 may exhibit premature breakdown at a bias voltage (e.g., 67 volts) less than approximately 110 volts during operation of the piezoelectric MIM device 100. In some embodiments, if the passivation layer 110 is formed to a thickness greater than approximately 3000 Angstroms, the piezoelectric MIM device 100 may have increased structural integrity but device performance will be degraded (e.g., when the piezoelectric MIM device 100 is configured as an actuator). This, in turn, may mitigate the change in shape the piezoelectric structure 106 may undergo.

Figure 13:
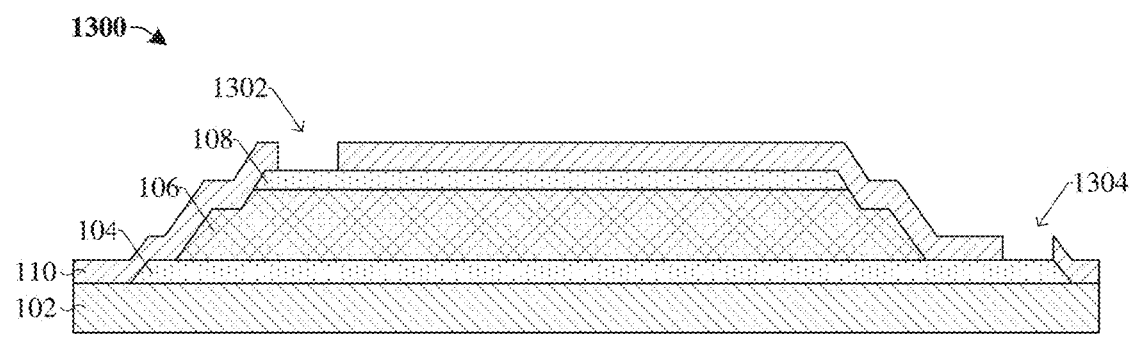

As shown in cross-sectional view 1300 of FIG. 13, the passivation layer 110 is patterned forming a first opening 1302 above a top surface of the top electrode 108 and forming a second opening 1304 above a top surface of the bottom electrode 104.

Figure 14:
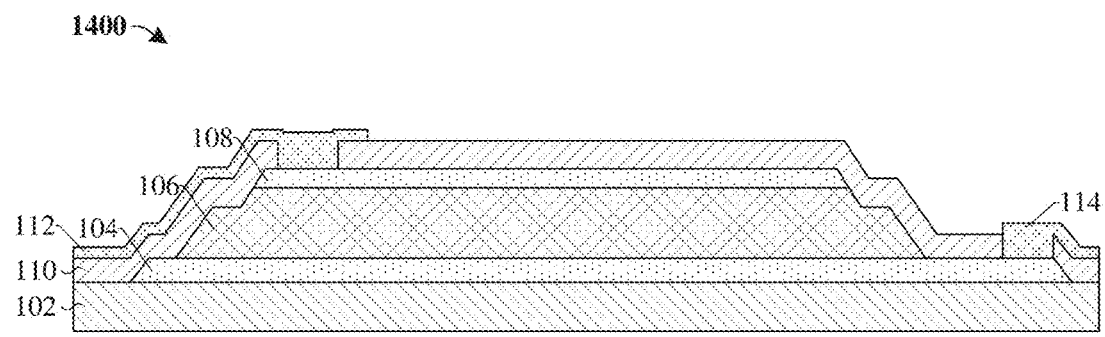

As shown in cross-sectional view 1400 of FIG. 14, a first conductive contact 112 is formed over the passivation layer 110 and the top electrode 108. The first conductive contact 112 directly contacts the top surface of the top electrode 108 and fills the first opening (1302 of FIG. 13). A second conductive contact 114 is formed over the passivation layer 110 and the bottom electrode 104. The second conductive contact 114 directly contacts the top surface of the bottom electrode 104 and fills the second opening (1304 of FIG. 13). In some embodiments, the first and second conductive contacts 112, 114 may, for example, be or comprise copper, aluminum, or the like. In some embodiments the first and second conductive contacts 112, 114 are comprised of a conductive material different than a material of the top electrode 108 and/or the bottom electrode 104.

Figure 15:
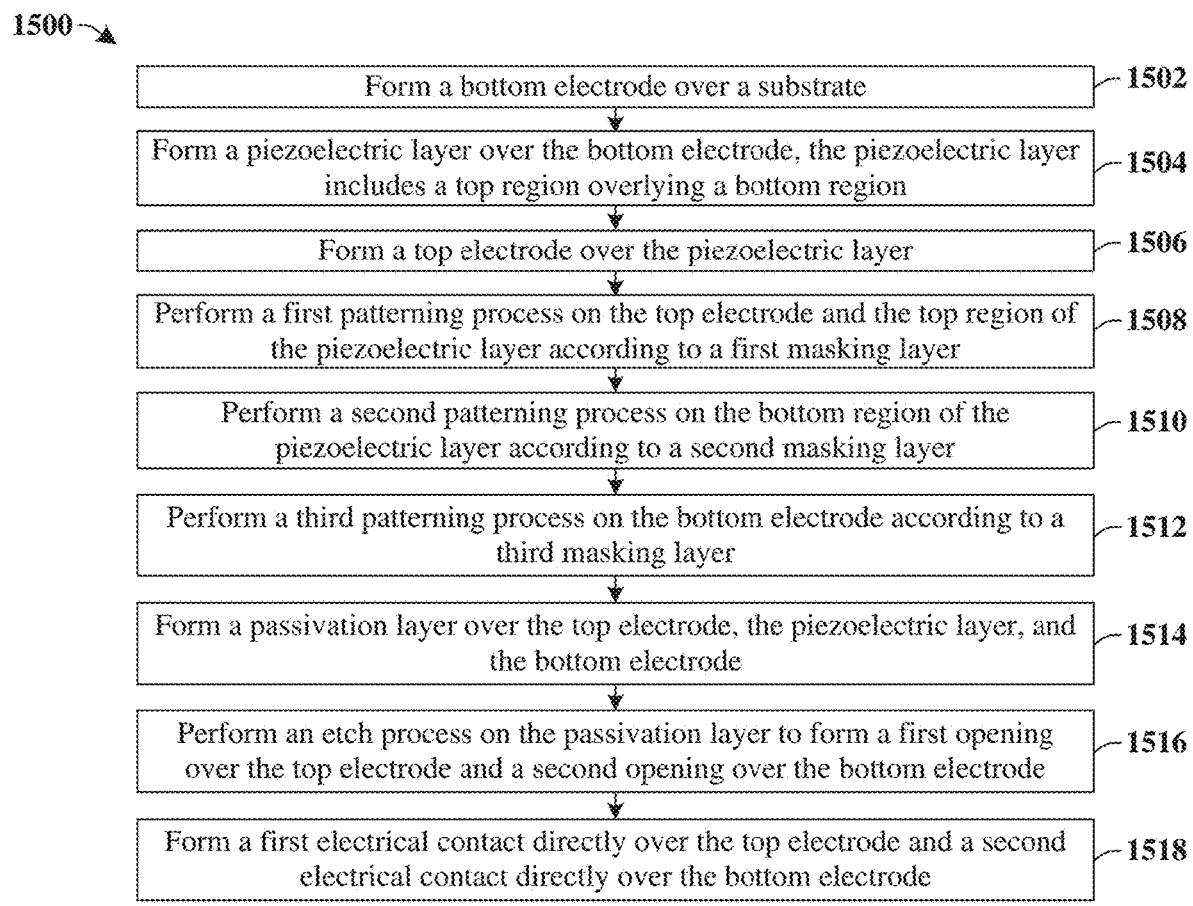
FIG. 15 illustrates a methodology in flowchart format that illustrates some embodiments of forming a MIM capacitor having a piezoelectric structure comprising a ledge in contact with a passivation layer.

FIG. 15 illustrates a method 1500 of forming a piezoelectric metal-insulator-metal (MIM) device in accordance with some embodiments. Although the method 1500 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At 1502, a bottom electrode is formed over a substrate. FIG. 6 illustrates a cross-sectional view 600 corresponding to some embodiments of act 1502.

At 1504, a piezoelectric layer is formed over the bottom electrode, the piezoelectric layer includes a top region overlying a bottom region. FIG. 6 illustrates a cross-sectional view 600 corresponding to some embodiments of act 1504.

At 1506, a top electrode is formed over the piezoelectric layer. FIG. 6 illustrates a cross-sectional view 600 corresponding to some embodiments of act 1506.

At 1508, a first patterning process is performed on the top electrode and the top region of the piezoelectric layer according to a first masking layer. FIGS. 6 and 7 illustrate cross-sectional views 600 and 700 corresponding to some embodiments of act 1508.

At 1510, a second patterning process is performed on the bottom region of the piezoelectric layer according to a second masking layer. FIGS. 8 and 9 illustrate cross-sectional views 800 and 900 corresponding to some embodiments of act 1510.

At 1512, a third patterning process is performed on the bottom electrode according to a third masking layer. FIGS.

10 and 11 illustrate cross-sectional views 1000 and 1100 corresponding to some embodiments of act 1512.

At 1514, a passivation layer is formed over the top electrode, the piezoelectric layer, and the bottom electrode. FIG. 12 illustrates a cross-sectional view 1200 corresponding to some embodiments of act 1514.

At 1516, an etch process is performed on the passivation layer to form a first opening over the top electrode and a second opening over the bottom electrode. FIG. 13 illustrates a cross-sectional view 1300 corresponding to some embodiments of act 1516.

At 1518, a first electrical contact is formed directly over the top electrode and a second electrical contact is formed directly over the bottom electrode. FIG. 14 illustrates a cross-sectional view 1400 corresponding to some embodiments of act 1518.

Accordingly, in some embodiments, the present disclosure relates to a method of forming a piezoelectric MIM device that includes a passivation layer configured to clamp a top electrode to a piezoelectric structure.

In some embodiments, the present application provides a piezoelectric device including: a bottom electrode; a top electrode overlying the bottom electrode; and a piezoelectric layer disposed between the bottom electrode and the top electrode, wherein the piezoelectric layer comprises a top region overlying a bottom region, outer sidewalls of the bottom region extend past outer sidewalls of the top region, wherein the outer sidewalls of the top region are aligned with outer sidewalls of the top electrode.

In some embodiments, the present application provides a metal-insulator-metal (MIM) device, including: a semiconductor substrate; a bottom electrode overlying the semiconductor substrate; a top electrode overlying the bottom electrode; a passivation layer overlying the top electrode; and a piezoelectric structure between the top electrode and the bottom electrode, wherein the piezoelectric structure comprises a first outer sidewall facing a first direction and a second outer sidewall facing the first direction, wherein the first outer sidewall is laterally offset the second outer sidewall by a ledge of the piezoelectric structure extending from the first outer sidewall to the second outer sidewall, and wherein the ledge of the piezoelectric structure is in direct contact with the passivation layer.

In some embodiments, the present application provides a method for forming a metal-insulator-metal (MIM) structure, the method including: forming a bottom electrode over a substrate; forming a piezoelectric layer over the bottom electrode, wherein the piezoelectric layer comprises a top region overlying a bottom region; forming a top electrode over the piezoelectric layer; performing a first patterning process on the top electrode and the top region of the piezoelectric layer according to a first masking layer; performing a second patterning process on the bottom region of the piezoelectric layer according to a second masking layer, wherein a size of the second masking layer is greater than a size of the first masking layer; performing a third patterning process on the bottom electrode according to a third masking layer, wherein a size of the third masking layer is greater than the size of the second masking layer; and forming a passivation layer over the top electrode, piezoelectric layer, and the bottom electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A piezoelectric device comprising:
   a bottom electrode;
   a top electrode overlying the bottom electrode; and
   a piezoelectric layer disposed between the bottom electrode and the top electrode, wherein the piezoelectric layer comprises a top region overlying a bottom region, outer sidewalls of the bottom region extend past outer sidewalls of the top region, wherein the outer sidewalls of the top region are aligned with outer sidewalls of the top electrode, wherein the top region directly contacts the bottom region; and
   a passivation layer overlying the top electrode and the piezoelectric layer, wherein the passivation layer continuously extends from the bottom region across the outer sidewalls of the top region to an upper surface of the top electrode, wherein the passivation layer comprises a first outer sidewall facing a first direction and a second outer sidewall facing the first direction, wherein the first outer sidewall is laterally offset from the second outer sidewall by an upper surface of the passivation layer extending from the first outer sidewall to the second outer sidewall, and wherein the upper surface of the passivation layer is disposed vertically above a bottom surface of the top electrode.

2. The piezoelectric device of claim 1, further comprising:
   metal contacts extending through the passivation layer to the top electrode and the bottom electrode, respectively.

3. The piezoelectric device of claim 2, wherein an outer sidewall of the bottom region is laterally offset from an outer sidewall of the bottom electrode by an upper ledge of the bottom electrode, wherein the upper ledge of the bottom electrode is in direct contact with the passivation layer.

4. The piezoelectric device of claim 3, wherein an outer sidewall of the top electrode is laterally offset from the outer sidewall of the bottom region by an upper ledge of the bottom region, wherein the upper ledge of the bottom region is in direct contact with the passivation layer.

5. The piezoelectric device of claim 4, wherein the upper ledge of the bottom electrode is longer than the upper ledge of the bottom region.

6. The piezoelectric device of claim 1, wherein the outer sidewalls of the top electrode and the outer sidewalls of the top region are slanted.

7. The piezoelectric device of claim 6, wherein the outer sidewalls of the top electrode slant laterally in opposite directions, wherein the outer sidewalls of the top region slant laterally in opposite directions.

8. The piezoelectric device of claim 1, wherein the outer sidewalls of the top electrode and the outer sidewalls of the top region slant at a first angle relative to a line perpendicular to a bottom surface of the piezoelectric layer, wherein the outer sidewalls of the bottom region slant at a second angle relative to the line perpendicular to the bottom surface of the piezoelectric layer, wherein the first angle is different than the second angle.

9. The piezoelectric device of claim 1, wherein a thickness of the bottom region is at least two times greater than a thickness of the top region, and wherein the top and bottom regions are a same material.

10. A metal-insulator-metal (MIM) device, comprising:
a semiconductor substrate;
a bottom electrode overlying the semiconductor substrate;
a top electrode overlying the bottom electrode;
a passivation layer overlying the top electrode;
a piezoelectric structure between the top electrode and the bottom electrode, wherein the piezoelectric structure comprises a first outer sidewall facing a first direction and a second outer sidewall facing the first direction, wherein the first outer sidewall is laterally offset from the second outer sidewall by a ledge of the piezoelectric structure extending from the first outer sidewall to the second outer sidewall, and wherein the ledge of the piezoelectric structure is in direct contact with the passivation layer; and
wherein the passivation layer comprises an inner sidewall that directly contacts an outer sidewall of the top electrode and the first outer sidewall of the piezoelectric structure, wherein the inner sidewall of the passivation layer is slanted relative to a top surface of the semiconductor substrate, wherein a thickness of the passivation layer directly overlying the ledge of the piezoelectric structure continuously decreases from the first outer sidewall to a first point laterally offset from the first outer sidewall by a non-zero distance in the first direction.

11. The MIM device of claim 10, wherein the passivation layer extends continuously from a top surface of the top electrode to a top surface of the bottom electrode, wherein the passivation layer directly contacts the ledge of the piezoelectric structure, wherein the outer sidewall of the top electrode faces the first direction.

12. The MIM device of claim 11, wherein the first outer sidewall and the outer sidewall of the top electrode are aligned.

13. The MIM device of claim 10, wherein the second outer sidewall is laterally offset from an outer sidewall of the bottom electrode by a ledge of the bottom electrode, wherein the ledge of the bottom electrode at least partially defines an uppermost surface of the bottom electrode, and wherein the outer sidewall of the bottom electrode faces the first direction.

14. The MIM device of claim 13, wherein the ledge of the bottom electrode is at least two times longer than the ledge of the piezoelectric structure.

15. The MIM device of claim 10, wherein a width of the piezoelectric structure continuously decreases from a top surface of the bottom electrode to the ledge of the piezoelectric structure, wherein the width of the piezoelectric structure continuously decreases from the ledge of the piezoelectric structure to a bottom surface of the top electrode.

16. The MIM device of claim 15, wherein the width of the piezoelectric structure discretely increases between the top electrode and the bottom electrode at the ledge of the piezoelectric structure.

17. A method for forming a metal-insulator-metal (MIM) structure, comprising:
forming a bottom electrode over a substrate;
forming a piezoelectric layer over the bottom electrode, wherein the piezoelectric layer comprises a top region overlying a bottom region;
forming a top electrode over the piezoelectric layer;
performing a first patterning process on the top electrode and the top region of the piezoelectric layer according to a first masking layer, wherein the first patterning process defines a first outer sidewall of the piezoelectric layer facing a first direction and an outer sidewall of the top electrode facing the first direction;
performing a second patterning process on the bottom region of the piezoelectric layer according to a second masking layer, wherein a size of the second masking layer is greater than a size of the first masking layer, wherein the second patterning process defines a second outer sidewall of the piezoelectric layer facing the first direction, wherein the first outer sidewall is laterally offset from the second outer sidewall by a ledge of the piezoelectric layer extending from the first outer sidewall to the second outer sidewall;
performing a third patterning process on the bottom electrode according to a third masking layer, wherein a size of the third masking layer is greater than the size of the second masking layer; and
forming a passivation layer over the top electrode, the piezoelectric layer, and the bottom electrode, wherein the passivation layer directly contacts the ledge of the piezoelectric layer, wherein the passivation layer comprises an inner sidewall that directly contacts the outer sidewall of the top electrode and the first outer sidewall of the piezoelectric layer, wherein the inner sidewall of the passivation layer is slanted relative to a top surface of the substrate, wherein a thickness of the passivation layer directly overlying the ledge of the piezoelectric layer continuously decreases from the first outer sidewall of the piezoelectric layer to a first point laterally offset from the first outer sidewall by a non-zero distance in the first direction.

18. The method of claim 17, further comprising:
performing an etch process on the passivation layer to form a first opening over the top electrode and a second opening over the bottom electrode; and
forming a first electrical contact directly over the top electrode and a second electrical contact directly over the bottom electrode.

19. The method of claim 17, wherein the passivation layer comprises a first pair of opposing outer sidewalls, wherein a distance between the first pair of opposing outer sidewalls continuously decreases from a top surface of the passivation layer in a direction towards the substrate.

20. The method of claim 19, wherein the first pair of opposing outer sidewalls of the passivation layer is disposed vertically above a bottom surface of the top electrode.

* * * * *